(12) United States Patent
Kamori

(10) Patent No.: US 11,827,971 B2
(45) Date of Patent: Nov. 28, 2023

(54) SPUTTERING TARGET

(71) Applicant: Dexerials Corporation, Tokyo (JP)

(72) Inventor: Yuichi Kamori, Tokyo (JP)

(73) Assignee: Dexerials Corporation, Tokyo (JP)

(*) Notice: Subject to any disclaimer, the term of this patent is extended or adjusted under 35 U.S.C. 154(b) by 0 days.

(21) Appl. No.: 17/265,923

(22) PCT Filed: Jul. 17, 2019

(86) PCT No.: PCT/JP2019/028053
§ 371 (c)(1),
(2) Date: Feb. 4, 2021

(87) PCT Pub. No.: WO2020/031635
PCT Pub. Date: Feb. 13, 2020

(65) Prior Publication Data
US 2021/0180180 A1 Jun. 17, 2021

(30) Foreign Application Priority Data
Aug. 9, 2018 (JP) .................. 2018-149843

(51) Int. Cl.
*C23C 14/34* (2006.01)
*C23C 14/08* (2006.01)

(52) U.S. Cl.
CPC ........ *C23C 14/3414* (2013.01); *C23C 14/086* (2013.01)

(58) Field of Classification Search
None
See application file for complete search history.

(56) References Cited

U.S. PATENT DOCUMENTS

| 2010/0206725 | A1 | 8/2010 | Zhang et al. |
| 2015/0321455 | A1* | 11/2015 | Asano .............. C08J 7/043 428/212 |
| 2016/0070033 | A1* | 3/2016 | Schlott ............. G02B 1/11 428/216 |
| 2016/0141156 | A1 | 5/2016 | Watanabe et al. |
| 2019/0355389 | A1 | 11/2019 | Tauchi |

FOREIGN PATENT DOCUMENTS

| CN | 103966559 A | 8/2014 |
| JP | 2005-251237 A | 9/2005 |
| JP | 2006-213964 A | 8/2006 |

(Continued)

OTHER PUBLICATIONS

International Search Report isssued in Application No. PCT/JP2019/025503, dated Sep. 17, 2019 (3 pages).

(Continued)

*Primary Examiner* — Jason Berman
(74) *Attorney, Agent, or Firm* — Osha Bergman Watanabe & Burton LLP

(57) ABSTRACT

The present invention provides a sputtering target which has low risk to the human body, and which is able to be suppressed in the occurrence of a crack even in cases where sputtering is carried out at a high output power for a long period of time.

A sputtering target contains Zn as a main component, contains specific metals including Zr in specific compositions, and contains a complex oxide of Zr.

9 Claims, 1 Drawing Sheet

(56) References Cited

FOREIGN PATENT DOCUMENTS

| | | | |
|---|---|---|---|
| JP | 2006-299307 | A | 11/2006 |
| JP | 2009-62585 | A | 3/2009 |
| JP | 2015-214436 | A | 12/2015 |
| JP | 2015214437 | A | 12/2015 |
| JP | 2018-137025 | A | 8/2018 |
| JP | 6557750 | B1 | 8/2019 |
| TW | 201737246 | A | 10/2017 |
| WO | 2017/159561 | A1 | 9/2017 |

OTHER PUBLICATIONS

Written Opinion issued in International Application No. PCT/JP2019/025503, dated Sep. 17, 2019 (6 pages).
Notice of Reasons for Refusal issued in Japanese Application No. 2018-149843 dated Jun. 7, 2022 (11 pages).
Office Action issued in Taiwanese Application No. 108128280, dated Dec. 5, 2022 (13 pages).
Office Action issued in Chinese Application No. 201980048941.3, dated Aug. 26, 2022 (15 pages).
Office Action issued in Chinese Application No. 201980048941.3, dated Mar. 4, 2023 (14 pages).

\* cited by examiner

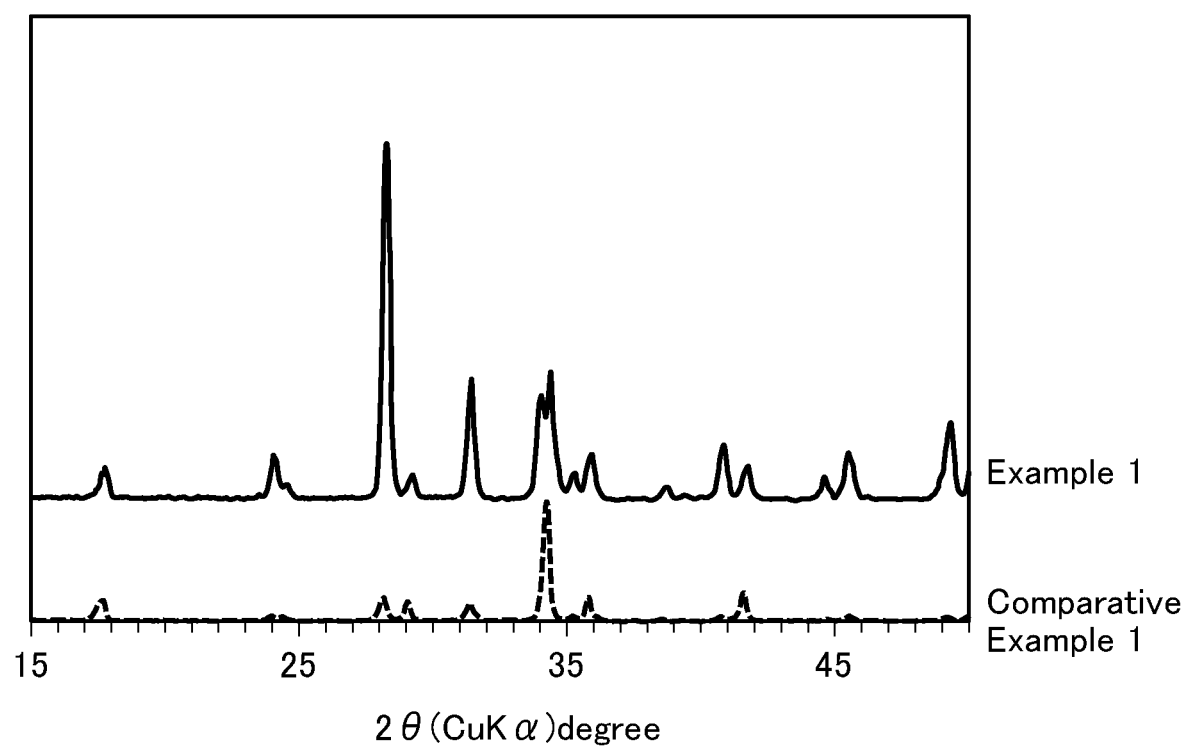

SPUTTERING TARGET

TECHNICAL FIELD

The present invention relates to a sputtering target. In more detail, it relates to a sputtering target for protective film formation on an optical storage medium.

BACKGROUND ART

In recent years, accompanying the development into higher definition televisions, and networks such as cloud computing, and the increase in data volume handled by PCs, the exploitation and commercialization of high-volume optical information recording media (optical disks) has been progressing.
Recordable optical recording media are classified into rewritable type such as BD-RE, and write-once type such as BD-R.

Herein, the optical information recording medium comes to be a laminate structure having a protective layer consisting of a dielectric layer above and below the recording layer, and a $ZnS$—$SiO_2$-based material is used as the protective layer (refer to Patent Document 1).
However, the ZnS-based dielectric layer has had a problem in that S (sulfur component) diffuses in the recording layer and causes the recording performance to decline.

Therefore, a sputtering target with $ZrO_2$ as the main component has been proposed with the object of forming a protective layer free of sulfide (refer to Patent Document 2). However, the $ZrO_2$-based target induces a volumetric change by the crystalline structure changing from heat; therefore, when performing film formation by repeated heating for a long time at high power, cracks have occurred in the target.

In addition, as another type of protective film, $In_2O_3$-based materials have been proposed (refer to Patent Document 3).
However, $In_2O_3$ is suspected to be carcinogenic, and thus a reduction thereof or alternative material is being sought.
Patent Document 1: Japanese Unexamined Patent Application, Publication No. 2006-299307
Patent Document 2: Japanese Unexamined Patent Application, Publication No. 2005-251237
Patent Document 3: Japanese Unexamined Patent Application, Publication No. 2009-062585

DISCLOSURE OF THE INVENTION

Problems to be Solved by the Invention

The present invention has been made taking account of the above background art, and an object thereof is to provide a sputtering target having low risk to humans, and can suppress the occurrence of cracks, even in a case of conducting sputtering for a long time at high output.

Means for Solving the Problems

The present inventors conducted thorough examination of sputtering targets which do not use sulfur, suppress the content of Zr, and have lower risk to humans.
As a result thereof, it was found that it is possible to solve the above problem if establishing a sputtering target containing Zn as a main component, containing a specific metal including Zr in a specific composition, in which Zr constitutes a complex oxide, thereby arriving at completing the present invention.

In other words, the present invention is a sputtering target containing Zn, Sn, Zr and O, and containing a complex oxide of Zr, in which the content of Zn is 30 to 60 mol % relative to the metal component overall, and the content of Zr is 10 to 40 mol % relative to the metal component overall.

The sputtering target may have a maximum peak near the diffraction angle (2θ) of 28°, in the X-ray diffractometry by CuKα radiation.

The sputtering target may have a content of Sn of 10 to 30 mol % relative to the metal component overall.

The sputtering target may be free of In.

The complex oxide may contain Zn and Zr.

The sputtering target may further contain a complex oxide containing Zn and Sn.

The sputtering target may further contain at least one selected from the group consisting of Y, Mg and Ca.

The sputtering target may further contain Si.

The sputtering target may further contain Ga and/or Al.

The sputtering target may have a resistance value of no more than 10 Ω·cm.

The sputtering target may be for a protective film formation on an optical storage medium.

Effects of the Invention

The sputtering target of the present invention is a target having little risk to humans, and the occurrence of cracks is suppressed even in a case of conducting sputtering for a long time at high output.

In addition, a simple oxide lacks conductivity, and thus sputtering by direct current (DC) has been difficult; therefore, the sputtering target of the present invention enables DC sputtering due to having conductivity.
Additionally, the sputtering target of the present invention is a very beneficial target in the point of productivity of film due to the specific resistance value being low.

BRIEF DESCRIPTION OF THE DRAWINGS

FIG. 1 provides X-ray diffraction patterns of sputtering targets of Example 1 and Comparative Example 1.

PREFERRED MODE FOR CARRYING OUT THE INVENTION

Hereinafter, an embodiment of the present invention will be explained.

Sputtering Target

The sputtering target of the present invention contains Zn, Sn, Zr and O, and contains a complex oxide of Zr, in which the content of Zn is 30 to 60 mol % relative to the metal component overall, and the content of Zr is 10 to 40 mol % relative to the metal component overall.
(Components)
The sputtering target of the present invention contains Zn, Sn, Zr and O as essential components.
As essential components, it is possible to satisfy the characteristics of the film obtained by sputtering, by containing all of Zn, Sn, Zr and O.

The sputtering target of the present invention is preferably free of In.
This is because In forms an oxide having risk to humans.

By not containing In, it becomes a sputtering target of high safety.

In addition, the sputtering target of the present invention is preferably free of S.

S (sulfur component) is a substance which is diffuses in the recording layer, and becomes a cause for a decline in recording performance.

By not containing S in the sputtering target, it is possible to suppress a decline in recording performance of the optical information recording medium ultimately obtained.

The sputtering target of the present invention preferably further contains at least one selected from the group consisting of Y, Mg and Ca.

Furthermore, in the case of containing at least one selected from the group consisting of Y, Mg and Ca, it becomes possible to suppress volumetric change from heating of Zr which does not form the complex oxide, and thereby further improve the crack resistance.

The sputtering target of the present invention preferably further contains Si.

In the case of further containing Si, it becomes possible to further improve the crack resistance.

The sputtering target of the present invention preferably further contains Ga and/or Al.

In the case of further containing Ga and/or Al, it is possible to further lower the resistance value of the target, and becomes possible to further decrease abnormal discharge during DC sputtering, and thereby further improve crack resistance.

(Complex Oxide)

In the sputtering target of the present invention, the essential component Zr forms a complex oxide with another metal.

Herein, $ZrO_2$, which is a simple oxide of Zr, generates cracks in the target, when performing film formation by repeated heating for a long time at high output, due to inducing a volumetric change by the crystalline structure changing from heat.

In contrast, the sputtering target of the present invention can suppress the occurrence of cracking by the complex oxide of Zr being contained.

In addition, the sputtering target of the present invention has electrical conductivity by way of the existence of the complex oxide. For this reason, while sputtering by direct current (DC) has been difficult without having electrical conductivity with simple oxides, DC sputtering becomes possible by way of the sputtering target of the present invention.

DC sputtering has a fast film formation rate, and good sputtering efficiency, compared to RF sputtering, for example.

In addition, a DC sputtering apparatus is inexpensive, and control thereof is easy, and thus the power consumption is also low.

Furthermore, it also becomes possible to form a layer of thin film thickness by way of DC sputtering.

Therefore, the sputtering target of the present invention is a very beneficial target in the point of productivity of the film.

It should be noted that the complex oxide of Zr can be formed by thermal treatment of $ZrO_2$ powder and ZnO powder.

(Peak)

The sputtering target of the present invention has a maximum peak near the diffraction angle (2θ) of 28°, in X-ray diffractometry by CUKα radiation.

Near the diffraction angle (2θ) of 28°, the complex oxide of Zr and Zn appears.

(Constituent Metals of Complex Oxide)

The complex oxide formed by Zr preferably contains Zn and Zr. As the complex oxide containing Zn and Zr, $ZnZrO_3$ can be exemplified.

In addition, the sputtering target of the present invention preferably further contains a complex oxide containing Zn and Sn. As the complex oxide containing Zn and Sn, $Zn_2SnO_4$ can be exemplified.

(Composition of Target)

In the sputtering target of the present invention, the content of Zn is in the range of 30 to 60 mol % relative to the metal component overall.

It is preferably in the range of 40 to 60 mol %, and more preferably in the range of 45 to 55 mol %.

In the case of the content of Zn being less than 30 mol % relative to the metal component overall, the conductivity imparting effect is low, while in the case of exceeding 60 mol %, the proportion of other metal components constituting the target becomes small, and thus it is difficult to obtain a film of the desired characteristics.

In the sputtering target of the present invention, the content of Zr is in the range of 10 to 40 mol % relative to the metal component overall.

It is preferably in the range of 15 to 35 mol %, and more preferably in the range of 20 to 30 mol %.

In the case of the content of Zr being less than 10 mol % relative to the metal component overall, it becomes difficult to obtain a film of the desired characteristics, while in the case of exceeding 40 mol %, it is not preferable due to cracks tending to occur from heat during DC sputtering.

In the sputtering target of the present invention, the content of Sn is preferable set in the range of 10 to 30 mol % relative to the metal component overall.

It is more preferably in the range of 18 to 27 mol %, and particularly preferably in the range of 20 to 25 mol %.

In the case of the content of Sn being less than 10 mol % relative to the metal component overall, the conductivity imparting effect is low, while in the case of exceeding 30 mol %, it is not preferable because the density of the obtained target declines due to the sinterability declining, and thus abnormal discharge tends to occur.

(Resistance Value)

The sputtering target of the present invention preferably has a resistance value no more than 10 Ω·cm. The resistance value is more preferably no more than 5 Ω·cm, and particularly preferably no more than 1 Ω·cm.

If the resistance value is no more than 10 Ω·cm, it becomes possible to conduct DC sputtering without abnormal discharge.

(Relative Density Ratio)

The sputtering target of the present invention preferably has a relative density ratio of at least 90%.

The relative density ratio is more preferably at least 95%, and particularly preferably at least 97%.

If the relative density ratio is at least 90%, since the uniformity of the sputtered film rises, and it is possible to suppress the generation of particles during sputtering, the occurrence of cracks can be suppressed.

It should be noted that, as the method of improving the relative density ratio of the sputtering target, for example, a method of raising the sintering pressure upon sputtering target production can be exemplified.

(Application)

The sputtering target of the present invention is preferably a target for protective film formation of an optical recording medium. According to the present invention, it is possible to productively manufacture a protective film on an optical recording medium due to the risk to humans being low, and being able to suppress the occurrence of cracks in the target even inf a case of conducting sputtering for a long time at high output, and DC sputtering being possible.

Manufacturing Method of Sputtering Target

The manufacturing method of the sputtering target of the present invention is not particularly limited, and it is possible to adopt a well-known method being conducted in the present technical field.

For example, a method which wet mixes powder of oxides containing each metal element, and sinters the obtained mixed powder with a hot press or the like at high temperature and pressure can be exemplified. Alternatively, the HIP method (hot isostatic pressing sintering method) or the like may be adopted.

EXAMPLES

Next, examples, etc. of the present invention will be explained; however, the present invention is not to be limited to these examples, etc.

Example 1

(Preparation of Sputtering Target)

ZnO powder (purity: 99.9% or more; average particle size: 2 μm), $SnO_2$ powder (purity: 99.9% or more; average particle size: 1 μm) and $ZrO_2$ powder (purity: 99.9% or more; average particle size: 0.5 μm) were weighed so that the proportion of each component metal is a proportion of Zn:Zr:Sn=50:25:25 (atomic %).

In a nylon container, each of the weighed raw material powders, one part by mass of ethanol relative to the total mass of each raw material powder, and 0.5 parts by mass of zirconia balls (diameter: 5 mm) were charged into a nylon container, and wet mixing was performed for 20 hours by the ball mill method.

The slurry solution containing each of the mixed raw material powders was filtered using a sieve of 2 mm mesh to separate the zirconia balls.

The obtained slurry solution was heated to dry, and disintegrated using a sieve of 250 μm mesh, thereby obtaining the mixed powder.

The obtained mixed powder was filled into a mold made of carbon, and hot pressing (high-temperature high-pressure pressing) was performed with a sintering time of 2 hours in an argon atmosphere at a sintering temperature of 950° C., and sintering pressure of 400 kgf/cm². After hot pressing, the obtained sintered body was machined to prepare the sputtering target.

(Measurement of Resistance Value)

The obtained sputtering target was measured for resistance value using a resistivity meter (MCP-T610, manufactured by Mitsubishi Chemical Analytech).

The results are shown in Table 1.

(Relative Density Ratio)

For the obtained sputtering target, the measured density of the target relative to the theoretical density described below was calculated by ratio, and defined as the relative density ratio. Theoretical Density: A value obtained by dividing the weight blending ratio by specific gravity was calculated for each of the raw materials used, and the reciprocal of the sum thereof was defined thereas.

(Confirmation of Zr Complex Oxide)

For the obtained sputtering target, X-ray diffraction analysis by CuKα radiation was conducted, using a multipurpose X-ray diffractometer manufactured by Rigaku Corp.

The obtained diffraction pattern is shown in FIG. 1.

As shown in FIG. 1, a maximum peak is recognized near the diffraction angle (2θ) of 28°, and this peak is a peak appearing due to the formation of $ZnZrO_3$.

(Crack Occurrence Evaluation)

The obtained sputtering target was adhered to a copper backing plate using In solder.

This was attached to a normal sputtering device, and evacuation was performed to no more than $1 \times 10^{-4}$ Pa, following by introducing Ar gas and $O^2$ gas, and the device internal pressure was set to 0.3 Pa.

At this time, the partial pressure of oxygen ($O^2/Ar+O^2$) was set to 70%. Electric power of 12 W/cm² was applied with a DC power source, and sputtering was performed for 60 minutes.

As a result thereof, cracks did not occur during sputtering, and it was possible to stably form a film.

TABLE 1

|  |  | Example 1 | Example 2 | Example 3 | Example 4 | Example 5 | Example 6 | Example 7 |
|---|---|---|---|---|---|---|---|---|
| Composition (mol %) | Zn | 50 | 40 | 60 | 50 | 40 | 47.5 | 47.5 |
|  | Sn | 25 | 30 | 20 | 25 | 20 | 25 | 25 |
|  | Zr | 25 | 30 | 20 | 24.3 | 20 | 25 | 25 |
|  | Y | — | — | — | 0.7 | — | — | — |
|  | Si | — | — | — | — | 20 | — | — |
|  | Ga | — | — | — | — | — | 2.5 | — |
|  | Al | — | — | — | — | — | — | 2.5 |
| Resistance value(Ω · cm) |  | 0.5 | 3.0 | 0.2 | 0.2 | 2.0 | 1.1 | 0.06 |
| Relative density ratio(%) |  | 100 | 97 | 100 | 100 | 91 | 96 | 96 |
| Maximum peak near diffraction angle (2θ) of 28° |  | Present | Present | Present | Present | Present | Present | Present |
| Crack during sputtering |  | Absent | Absent | Absent | Absent | Absent | Absent | Absent |

Example 2, Example 3

Using ZnO powder, $SnO_2$ powder and $ZrO_2$ powder, the sputtering target was prepared similarly to Example 1, except for changing the proportion of each component metal as shown in Table 1, and evaluation was conducted.

The evaluation results are shown in Table 1.

Comparative Example 1

Using ZnO powder, $SnO_2$ powder and $ZrO_2$ powder, the sputtering target was prepared similarly to Example 1, except for changing the proportion of each component metal as shown in Table 2, and evaluation was conducted.

The pattern of X-ray diffraction by CuKα radiation is shown in FIG. 1, and the evaluation results are shown in Table 2.

As shown in FIG. 1, in the X-ray diffraction pattern of the sputtering target of Comparative Example 1, the peak near the diffraction angle (2θ) of 28° is small, and was evidently not the maximum peak.

TABLE 2

|  |  | Comparative Example 1 | Comparative Example 2 |
|---|---|---|---|
| Composition (mol %) | Zn | 30 | 45 |
|  | Sn | 15 | — |
|  | Zr | 55 | 55 |
|  | Y | — | — |
|  | Si | — | — |
|  | Ga | — | — |
|  | Al | — | — |
| Resistance value (Ω · cm) |  | 24 | >10$^6$ |
| Relative density ratio (%) |  | 85 | 100 |
| Maximum peak near diffraction angle (2θ) of 28° |  | Absent | Absent |
| Crack during sputtering |  | Present | Present |

Example 4

ZnO powder (purity: 99.9% or more; average particle size: 2 μm), SnO$_2$ powder (purity: 99.9% or more; average particle size: 1 μm) and ZrO$_2$/Y$_2$O$_3$ powder (Y$_2$O$_3$: 2.6 mol %; purity: 99.9% or more; average particle size: 0.6 μm) were weighed so that the proportion of each component metal is a proportion of Zn:Zr:Sn:Y=50:25:24.3:0.7 (atomic %).

Subsequently, the sputtering target was prepared similarly to Example 1, and evaluation was conducted.
The results are shown in Table 1.

Example 5

ZnO powder (purity: 99.9% or more; average particle size: 2 μm), SnO$_2$ powder (purity: 99.9% or more; average particle size: 1 μm) ZrO$_2$ powder (purity: 99.9% or more; average particle size: 0.5 μm) and SiO$_2$ powder (purity: 99.9% or more; average particle size: 4 μm) were weighed so that the proportion of each component metal is a proportion of Zn:Zr:Sn:Si=40:20:20:20 (atomic %).

Subsequently, the sputtering target was prepared similarly to Example 1, and evaluation was conducted.
The results are shown in Table 1.

Example 6

ZnO powder (purity: 99.9% or more; average particle size: 2 μm), SnO$_2$ powder (purity: 99.9% or more; average particle size: 1 μm) ZrO$_2$ powder (purity: 99.9% or more; average particle size: 0.5 μm) and Ga$_2$O$_3$ powder (purity: 99.99% or more; average particle size: 2 μm) were weighed so that the proportion of each component metal is a proportion of Zn:Zr:Sn:Ga=47.5:25:25:2.5 (atomic %).

Subsequently, the sputtering target was prepared similarly to Example 1, and evaluation was conducted.
The results are shown in Table 1.

Example 7

ZnO powder (purity: 99.9% or more; average particle size: 2 μm), SnO$_2$ powder (purity: 99.9% or more; average particle size: 1 μm) ZrO$_2$ powder (purity: 99.9% or more; average particle size: 0.5 μm) and Al$_2$O$_3$ powder (purity: 99.99% or more; average particle size: 0.1 μm) were weighed so that the proportion of each component metal is a proportion of Zn:Zr:Sn:Al=47.5:25:25:2.5 (atomic %).

Subsequently, the sputtering target was prepared similarly to Example 1, and evaluation was conducted.
The results are shown in Table 1.

Comparative Example 2

ZnO powder (purity: 99.9% or more; average particle size: 2 μm), and ZrO$_2$ powder (purity: 99.9% or more; average particle size: 0.5 μm) were weighed so that the proportion of each component metal is a proportion of Zn:Zr=45:55 (atomic %).

Subsequently, the sputtering target was prepared similarly to Example 1, and evaluation was conducted.
The results are shown in Table 2.

The invention claimed is:

1. A sputtering target comprising:
Zn, Sn, Zr Ca, and O, and being free of indium oxide,
wherein content of Zn is 30 to 60 mol % relative to overall metal component,
wherein content of Zr is 10 to 40 mol % relative to overall metal component, and
the sputtering target comprising a complex oxide of Zr.

2. The sputtering target according to claim 1, wherein the sputtering target has a maximum peak near the diffraction angle (2θ) of 28°, in X-ray diffractometry by CuKα radiation.

3. The sputtering target according to claim 1, wherein content of Sn is 10 to 30 mol % relative to overall metal component.

4. The sputtering target according to claim 1, wherein the complex oxide contains Zn and Zr.

5. The sputtering target according to claim 1, further comprising a complex oxide containing Zn and Sn.

6. The sputtering target according to claim 1, further comprising Si.

7. The sputtering target according to claim 1, further comprising Ga and/or Al.

8. The sputtering target according to claim 1, wherein the sputtering target has a resistance value of no more than 10 Ω·cm.

9. The sputtering target according to claim 1, wherein the sputtering target is for protective film formation on an optical storage medium.

* * * * *